United States Patent [19]
Yanagihara et al.

[11] Patent Number: 6,057,630
[45] Date of Patent: May 2, 2000

[54] SURFACE ACOUSTIC WAVE DEVICE

[75] Inventors: Hitoshi Yanagihara, Kamakura; Takashi Shiba, Yokosuka; Katsumi Itoh, Yokohama; Akitsuna Yuhara, Tokyo, all of Japan

[73] Assignee: Hitachi Media Electronics Co., Ltd., Iwate-ken, Japan

[21] Appl. No.: 09/061,125

[22] Filed: Apr. 16, 1998

[30] Foreign Application Priority Data

Apr. 17, 1997 [JP] Japan ................................ 9-100462

[51] Int. Cl.[7] ............................. H01L 41/04; H03H 9/00
[52] U.S. Cl. ..................... 310/313 B; 333/151; 333/194
[58] Field of Search ........................... 310/313 B, 313 D; 333/151, 194, 195

[56] References Cited

U.S. PATENT DOCUMENTS

| 4,201,964 | 5/1980 | Noro et al. | 333/151 |
| 4,485,364 | 11/1984 | DeVries | 333/194 |
| 4,604,623 | 8/1986 | Skeie | 342/51 |
| 4,642,507 | 2/1987 | Suthers et al. | 310/313 B |
| 5,304,965 | 4/1994 | Manner | 333/194 |

FOREIGN PATENT DOCUMENTS

| 0 0310685 A2 | 7/1981 | European Pat. Off. . |
| 57-61211 | 12/1982 | Japan . |
| 61-010309 | 1/1986 | Japan . |
| 3-12485 | 2/1991 | Japan . |

*Primary Examiner*—Nestor Ramirez
*Assistant Examiner*—Peter Medley
*Attorney, Agent, or Firm*—Antonelli, Terry Stout & Kraus, LLP

[57] ABSTRACT

There is provided a surface acoustic wave device for use as a filter in a television receiver set which can reduce reflection waves generated from outermost electrodes of input and output interdigital transducers to improve various filter characteristics. In the surface acoustic wave device having, on a piezoelectric substrate, the input interdigital transducer for converting an electric signal into a surface acoustic wave and the output interdigital transducer, disposed to oppose the input interdigital transducer, for converting the surface acoustic wave resulting from the conversion by the input interdigital transducer into an electric signal, a first dummy electrode is provided to a first outermost electrode finger of the output interdigital transducer, the first outermost electrode finger being located at one end of the output interdigital transducer opposite to the input interdigital transducer, and having an electrode aperture length of $\lambda/4$ where n represents a wavelength of the surface acoustic wave, and a second dummy electrode is provided to a second outermost electrode finger of the input interdigital transducer, the second outermost electrode finger being located at one edge of the input interdigital transducer opposite to the output interdigital transducer, and having an electrode aperture length of $\lambda/4$.

12 Claims, 5 Drawing Sheets

SURFACE ACOUSTIC WAVE DEVICE

BACKGROUND OF THE INVENTION

The present invention relates to a surface acoustic wave device (hereinafter referred to as a SAW device) having a piezoelectric substrate and input/output interdigital transducer formed thereon and more particularly, to a SAW device suitable for use as a band-pass filter in a television receiver set.

The SAW device used as the band-pass filter for the television receiver set includes an input interdigital transducer (hereinafter referred to as an input IDT) and an output interdigital transducer (hereinafter referred to as an output IDT), each of the input and output IDT's having electrode fingers interdigitally arranged on the piezoelectric substrate. The input and output IDT's are spaced apart by a predetermined distance on the piezoelectric substrate and a surface acoustic wave propagating through these IDT's is utilized to obtain a desired frequency characteristic.

A conventional SAW device is constructed as shown in FIG. 7, having a piezoelectric substrate 1, an input IDT 2, an output IDT 3, an earth electrode 4, bus bars 7 and 8 and electrode fingers 9. Reference numeral 5 designates a main lobe and reference numeral 6 designates a side lobe.

In the figure, the input IDT 2 is so arranged as to oppose the output IDT 3 on the piezoelectric substrate 1. Typically, the piezoelectric substrate 1 is made of a material such as lithium niobate (LiNbO3) or lithium tantalate (LiTaO$_3$). Each of the input and output IDT's 2 and 3 has two bus bars 7 and 8 and electrode fingers 9 provided to each of the bus bars 7 and 8. In the illustrated example, two electrode fingers 9 provided to the bus bar 7 mate with two electrode fingers 9 provided to the bus bar 8 and they are arranged alternately to overlap with each other, thereby forming a split type transducer. In any one of the IDT's 2 and 3, the overlapping aperture of electrode finger is constant to provide a normal type transducer and in the other, the overlapping aperture length of transducer finger is sequentially changed to provide an overlapping aperture weighted transducer.

In the SAW device constructed as above, an electric signal applied to the input IDT 2 is converted into a surface acoustic wave which propagates to the output IDT 3, so that the surface acoustic wave is transferred into an electric signal by means of the output IDT 3. In the SAW filter, a desired filter characteristic is obtained through the operation as above.

Generally, in this type of SAW filter, any one of the IDT's 2 and 3 has the normal type transducer and the other has the aperture weighted transducer as described above and in this example, the input IDT 2 is of the normal type transducer having an overlapping aperture length of W1 and the output IDT 3 is of the overlapping aperture weighted transducer having an overlapping aperture length of W2. The electrode finger overlapping aperture length W2 in the output IDT 3 is maximized at a central portion to provide the main lobe 5 having a maximum overlapping aperture length and is gradually decreased toward the both sides of the central portion to provide the side lobe 6 having a smaller electrode finger overlapping aperture length. Interposed between the input and output TDT's is the earth electrode 4 for suppressing a direct feed through (electromagnetic) wave.

Incidentally, in the SAW device, the desirable filter characteristic is so sophisticated that as the band is broadened or the side lobe suppression is increased, the number of electrode fingers 9 constituting the input and output IDT's 2 and 3 must be increased. With the number of the electrode fingers increased, however, the ripple tends to increase within a desired frequency band in the frequency/amplitude characteristic and group delay time characteristic of the SAW device. Examples of known methods of suppressing the ripple are disclosed in Japanese Patent Publication No.57-61211 and Japanese Patent Publication No.3-12485.

An ideal time domain characteristic in the SAW filter has a shape analogous to the electrode finger overlapping aperture length W2 of the aperture weighted transducer 3. Actually, however, when the time domain characteristic of the SAW device is measured, a response waveform as shown in FIG. 8 is obtained.

To explain, a surface acoustic wave reaches the output IDT 3 and then, each time that the surface acoustic wave passes the respective electrode finger 9 of the output IDT 3, an electric signal having an amplitude corresponding to an electrode finger overlapping aperture length W2 of an electrode finger through which the wave passes is obtained. In that case, since the electrode finger overlapping aperture length W2 is maximized in the central portion of the output IDT 3 and is minimized at opposite electrode edges where outermost electrode fingers 9a and 9b are provided, it is expected that the amplitude of the electric signal generated as the surface acoustic wave propagates through the output IDT 3 is initially small, gradually increased, maximized at main lobe A and gradually decreased at side lobe B. Practically, however, a response waveform generated when the surface acoustic wave passes through the outermost electrode finger 9a on the side of input IDT 2 has a very high amplitude as indicated by C' in FIG. 8, as compared to an ideal amplitude indicated by C which is smaller in conformity with an electrode finger overlapping aperture length W2 at the outermost electrode finger 9a. Similarly, a response waveform generated when the surface acoustic wave passes through the outermost electrode finger 9b located at one end opposite to the input IDT 2 has a very high amplitude as indicated by D' in FIG. 8, as compared to an ideal amplitude indicated by D which is smaller in conformity with an electrode finger overlapping aperture length W2 at the outermost electrode finger 9b.

In addition, even after the time that the surface acoustic wave has passed the output IDT 3, a high response waveform as indicated by E in FIG. 8 is obtained.

Because of the generation of the undesired high-amplitude response waveforms C', D' and E, a high ripple is caused within the desired frequency band in the frequency/amplitude characteristic and group delay time characteristic of the SAW device.

These undesired response waveforms generated in the SAW device are of different modes and they are principally classified into the following three kinds on the basis of causes of generation.

(1) Substrate end surface reflection wave: an undesired wave which passes through the input and output IDT's 2 and 3 so as to be reflected at the edge surface of the piezoelectric substrate 1, reaching the output IDT 3.

(2) An electrode end reflection wave: an undesired response wave caused by a surface acoustic wave which is reflected at the electrode end of output IDT 3 at one end opposite to the input IDT 2 so as to again propagate through the output IDT 3 in the reverse direction. This is the undesired response waveform E shown in FIG. 8.

(3) An outermost electrode finger generating wave: an undesired response wave generated at either electrode end of the output IDT 3. This is the undesired response waveform C' or D' shown in FIG. 8.

The substrate end surface reflection wave in the above (1) can be suppressed by forming surface acoustic wave absorbers between an outermost electrode finger 9d of the input IDT 2 and the edge of the piezoelectric substrate 1 and between the outermost electrode finger 9b of the output IDT 3 and the edge of the piezoelectric substrate 1, respectively.

Further, an example of the method for suppression of the electrode end reflection wave in the above (2) is disclosed in the aforementioned Japanese Patent Publication No.57-61211. More specifically, when the input IDT has a aperture weighted transducer and the output IDT has a normal type transducer, a dummy electrode having an electrode aperture length of $\lambda/4$ ($\lambda$: wavelength of the surface acoustic wave) is formed at an outermost electrode finger of the aperture weighted transducer in order to suppress a reflection wave due to reflection of the surface acoustic wave which is generated by the aperture weighted transducer and is then reflected at an edge of aperture weighted transducer at one end opposite to the normal type transducer. The surface acoustic wave reflected at the outermost electrode finger is $\lambda/2$ or 180° dephased from the surface acoustic wave reflected at the outer end of the dummy electrode and these waves cancel each other so as to be suppressed.

SUMMARY OF THE INVENTION

The prior art can decrease the generated undesired response waveform to some extent but for the sake of sufficiently suppressing the ripple within the desired frequency band in the frequency/amplitude characteristic and group delay time characteristic, all types of undesired response waveforms inclusive of the outermost electrode finger generating wave in the above (3) must be suppressed. The prior arts fail to take this into consideration.

As to the electrode end reflection wave in the above (2), not only a reflection wave at the outermost electrode finger 9b of the aperture weighted transducer serving as the output IDT 3 but also a reflection wave at the outermost electrode finger 9d of normal type transducer, serving as the input IDT 2, at one end opposite to the output IDT 3 is responsible for generation of undesired response waveforms. More specifically, the reflection wave passes through the normal type transducer 2 to reach the aperture weighted transducer 3 while behaving as a response waveform appearing at the central portion where the electrode finger overlapping aperture length W2 is maximized. This response waveform is not depicted in FIG. 8 because it is apparently concealed by the main lobe response waveform. Conventionally, this type of electrode end reflection wave has not been taken into account, either.

With the above in mind, it should be appreciated that in the conventional SAW device, the ripple within the desired frequency band in the frequency/amplitude characteristic and group delay time characteristic can be decreased to some extent but cannot be suppressed sufficiently.

The present invention contemplates elimination of the conventional problems and it is an object of the present invention to provide a high-quality SAW device which can sufficiently suppress the undesired response waveforms to improve the frequency/amplitude characteristic and group delay time characteristic within frequency pass band.

To accomplish the above object, according to the present invention, dummy electrodes each having an electrode aperture length of $\lambda/4$ are provided to an outermost electrode finger of input IDT at one end opposite to an output IDT and to an outermost electrode finger of output IDT at one end opposite to the input IDT, respectively.

With this construction, in either IDT, a reflection wave from the outermost electrode finger is $\lambda/2$ or 180° dephased, at the outermost electrode finger, from a reflection wave from the outer edge of the dummy electrode and they cancel with each other so as to be suppressed. Accordingly, the electrode edge reflection waves generated at the input and output IDT's, respectively, can be suppressed and the undesired response wave in the aforementioned (2) can be suppressed more sufficiently in the present invention than in the prior art.

Further, according to the present invention, at opposite edges of the output interdigital transducer, dummy electrodes are provided to outermost electrode fingers on the hot side, the dummy electrodes each having a length which is $\lambda/2$ of that of the outermost electrode finger and an electrode aperture length of ½.

By studying results of experiments conducted by the inventors of the present invention, the following is found in connection with the outermost electrode finger generating wave in the aforementioned (3).

More particularly, by forming surface acoustic wave absorbers on 2 to 3 pairs of outermost electrode fingers of the aperture weighted transducer, an undesired response generated from the vicinity of the outermost edge can be suppressed. Even when the location of the outermost electrode fingers of the aperture weighted transducer is changed, an undesired response waveform is also generated from the vicinity of the outermost electrode fingers. Even when the same signal as that used in an ordinary SAW filter is applied to the normal type transducer and both of the confronting electrode fingers of the aperture weighted transducer are used as hot (+) electrodes, an undesired response waveform generated from the vicinity of each of the outermost electrode fingers of the aperture weighted transducer is observed. The undesired response waveform is generated from the outermost electrode finger at the hot polarity but no undesired response waveform is generated from the outermost electrode finger on the earth side.

The above holds true for the normal type transducer, thus proving that apart from a normal response to a signal applied across the confronting electrode fingers of the interdigital transducer, an electric charge is generated between an electrode on the piezoelectric substrate and an earth side electrode such as the stem and the electric charge is concentrated to the outermost electrode finger of the interdigital transducer to cause an undesired response wave to be generated from the outermost electrode finger.

In order to suppress the undesired response waveform, a wave which is in opposite phase to (180° dephased from) the outermost electrode finger generating wave may be generated at the outermost electrode finger. Through this, these waves cancel with each other to suppress the outermost electrode finger generating wave.

As has been described, in the present invention, the dummy electrodes are provided, at opposite ends of the output IDT, to outermost electrode fingers on the hot side and each of the dummy electrodes has a length which is ½ of that of the outermost electrode finger and an electrode aperture length of $\lambda/2$, so that a new wave is generated which is in opposite phase to the outermost electrode finger generating wave, thereby ensuring that the effect of sufficiently suppressing the outermost electrode finger generating wave can be obtained. Through this, the undesired response wave in the aforementioned (3) which has not hitherto been taken into account can be suppressed sufficiently.

For the purpose of further improving the frequency/amplitude characteristic and group time delay characteristic, both of a dummy electrode having an electrode aperture length of λ/4 and a dummy electrode having an electrode aperture length of λ/2 are preferably provided.

DESCRIPTION OF THE PREFERRED EMBODIMENTS

The present invention will now be described by way of example with reference to the accompanying drawings.

Figure 1:
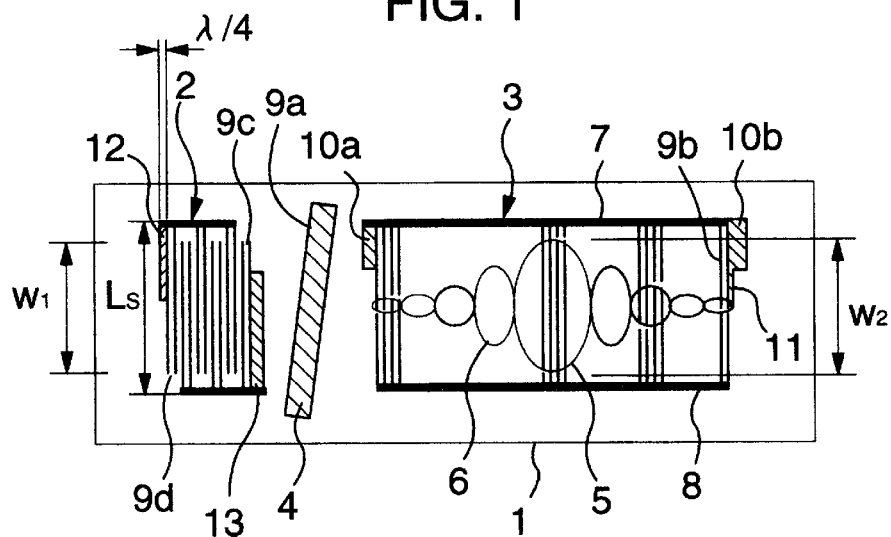
FIG. 1 is a diagram showing a first embodiment of a SAW device according to the present invention.
Figure 7:
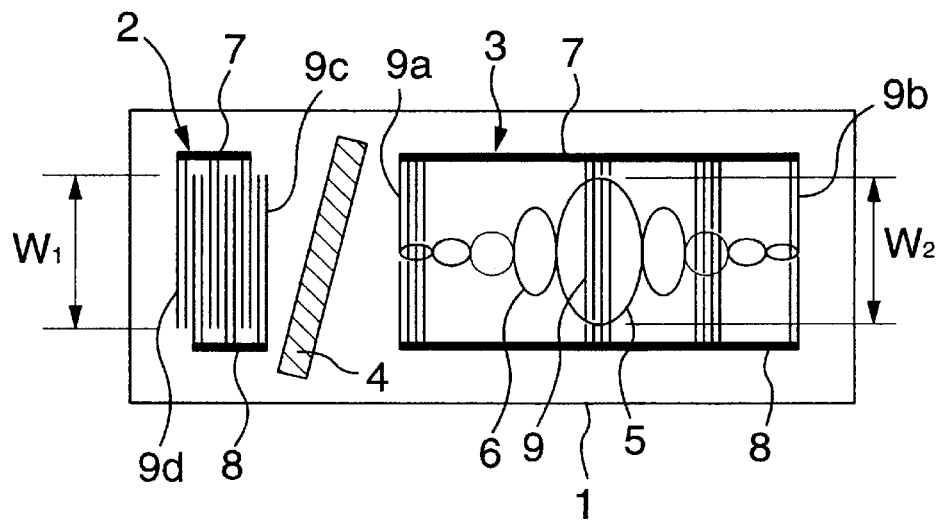
FIG. 7 is a diagram showing an example of a conventional SAW device.

Referring to FIG. 1, a first embodiment of a SAW device according to the present invention is constructed as shown therein, having dummy electrodes 10a, 10b, 11 and 12 and a dummy electrode 13 for phase correction. Other components corresponding to those in FIG. 7 are designated by identical reference numerals and will not be described herein to avoid prolixity.

Supposedly, the present embodiment is applied to a SAW filter for domestic digital CATV (Cable Television).

In the SAW filter shown in FIG. 1, $LiTaO_3$ is used for a piezoelectric substrate 1, a normal type transducer is used for an input ITD 2 and an aperture weighted transducer is used for an output IDT 3. An earth electrode 4 for suppression of a feed through wave is interposed between the IDT's 2 and 3. The earth electrode 4 is formed by using, for example, aluminum as an electrode material, vapor-depositing aluminum through, for example, thin film technique and patterning a deposited thin film through lithography technique.

As a transducer of each of the IDT's 2 and 3, a split type electrode is employed in which the distance between adjacent electrode fingers is λ/8, where λ is the wavelength of a surface acoustic wave, and the electrode has a thickness of 7000 Å. The side of bus bar 7 is the hot side and the side of bus bar 8 is the earth side.

Figure 2:
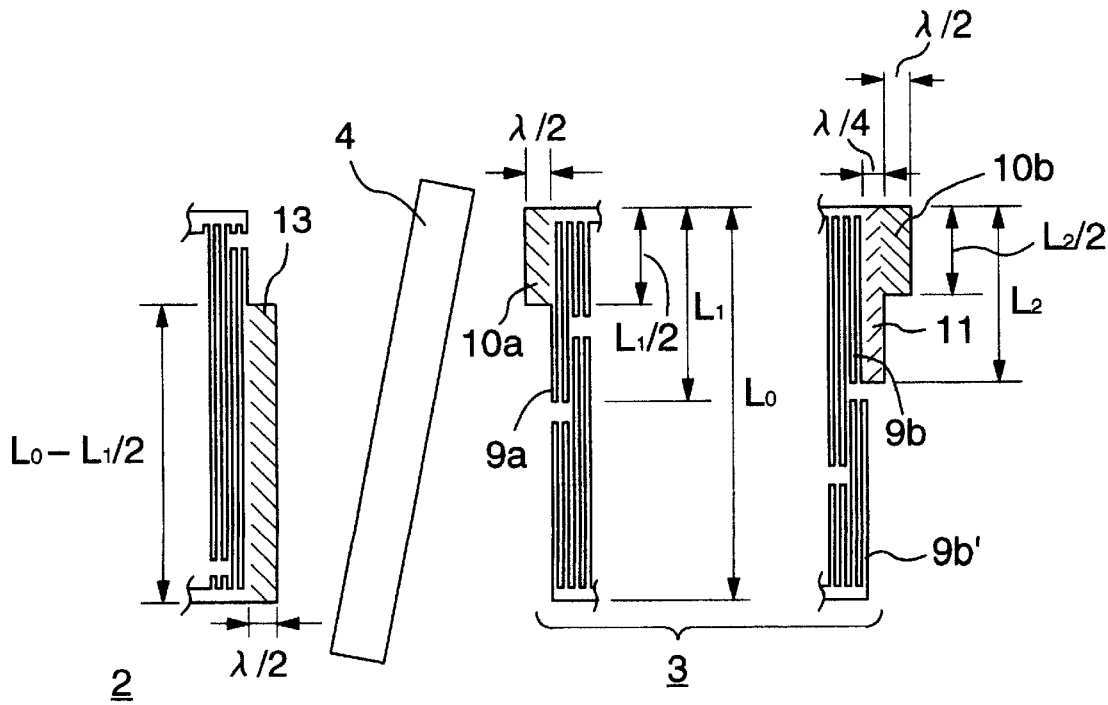
FIG. 2 is an enlarged view showing essential parts of the embodiment shown in FIG. 1.

Referring to FIG. 2, essential parts of the IDT's 2 and 3 of FIG. 1 are illustrated in enlarged form, with an outermost electrode finger designated by 9b' and portions corresponding to those in FIG. 1 designated by identical reference numerals. In FIG. 2, the output IDT 3 has, at one end opposite to the input IDT2, an outermost electrode finger 9b on the side of bus bar 7 (hot side), and the outermost electrode finger 9b is provided with the dummy electrode 11 having a length which substantially equals a length $L_2$ of the outermost electrode finger 9b (the length of each electrode finger is defined as a distance between the outer side of the bus bar 7 or 8 and the tip end of each electrode finger) and an electrode aperture length of λ/4. This dummy electrode 11 is contiguous to the dummy electrode 10b having a length which is equal to ½ of the length $L_2$ of the outermost electrode finger 9b and an electrode aperture length of λ/2. Further, the output IDT 3 has, at the other end close to the input IDT 2, an outermost electrode finger 9a on the side of bus bar 7, and the outermost electrode finger 9a is provided with the dummy electrode 10a having a length which substantially equals ½ of a length $L_1$ of the outermost electrode finger 9a and an electrode aperture length of λ/2.

On the other hand, the input IDT 2 has, at one end opposite side to the output IDT 3, an outermost electrode finger 9d (see FIG. 1) which is provided with the dummy electrode 12 having a length which substantially equals ½ of a length of the outermost electrode finger 9d and an electrode aperture length of λ/4. In addition, the input IDT 2 has, at the other end close to the output IDT 3, an outermost electrode finger 9c (see FIG. 1) which is provided with the dummy electrode 13 for phase correction.

Figure 8:
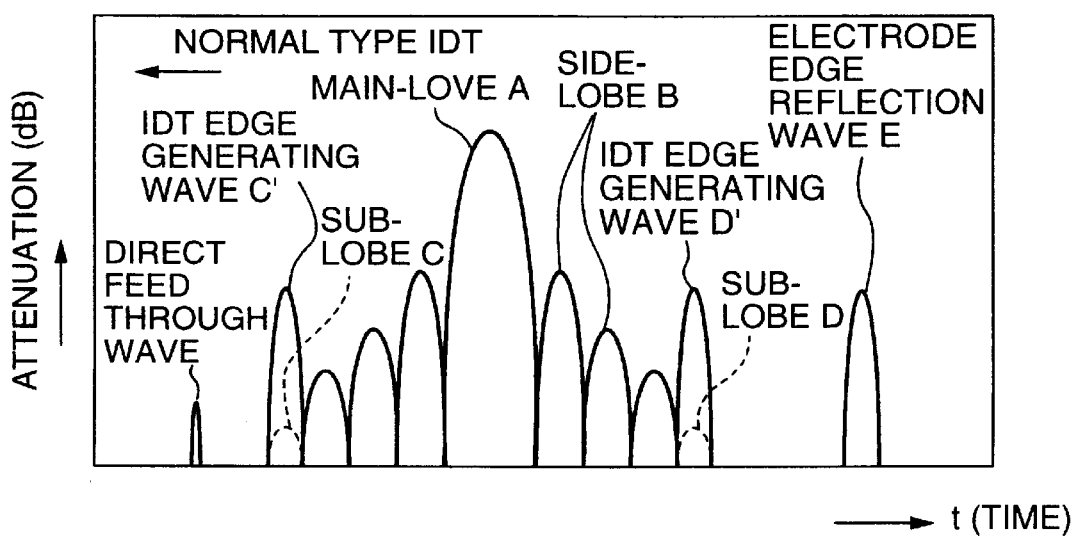
FIG. 8 is a graph showing a filter characteristic of the SAW device shown in FIG. 7.

With this construction, when a surface acoustic wave generated in the input IDT 2 reaches the output IDT 3, the outermost electrode finger 9a on the hot side generates an outermost electrode finger generating wave C' (more specifically, (C'–C)) as shown in FIG. 8. Concurrently therewith, the dummy electrode 10a provided to the outermost electrode finger 9a generates an undesired generation wave which is λ/2 or 180° dephased from the outermost electrode finger generating wave C'. In that case, since the length of the dummy electrode 10a is half the length $L_1$ of the outermost electrode finger 9a on the hot side as described previously, the outermost electrode finger generating wave C' generated at a portion of outermost electrode finger 9a which is removed of the dummy electrode 10a has an intensity substantially equalling that of the undesired generation wave generated at the dummy electrode 10a and consequently, these waves cancel with each other to suppress the outermost electrode finger generation wave C'. Accordingly, a response waveform C having an intensity as shown in FIG. 8 which conforms with an electrode finger overlapping aperture length W2 can be obtained from the outermost electrode finger 9a.

When the surface acoustic wave reaches the other electrode end, a portion provided with only the dummy electrode 11 and a portion provided with the dummy electrodes 11 and 10b generate, at the outermost electrode finger 9b on the hot side, outermost electrode finger generating waves which are λ/2 dephased from each other and these waves cancel with each other to suppress the outermost electrode finger generating wave (D'–D) as shown in FIG. 8, so that a response waveform D having an intensity which conforms to an electrode finger overlapping aperture length W2 at the outermost electrode finger 9b can be obtained.

Further, in the present embodiment, the electrode edge reflection wave E caused as shown in FIG. 8 by reflection of the surface acoustic wave at the outermost electrode finger 9b and the confronting outermost electrode finger 9b' on the earth side can also be decreased. The reason for this is that the dummy electrode 11 of λ/4 electrode aperture length and dummy electrode 10b of λ/2 are provided to the outermost electrode finger 9b and so an electrode end reflection wave generated from the outermost electrode finger 9b can be 180° dephased from an electrode end reflection wave generated from the outermost electrode finger 9b'. More particularly, from the electrode end reflection wave generated from the outermost electrode finger 9b', an electrode end reflection wave generated from the portion of outermost electrode finger 9b where only the dummy electrode 11 is provided is $\lambda/2$ ($=2\times\lambda/4$) dephased and an electrode end reflection wave generated from the portion of outermost electrode finger 9b where both the dummy electrodes 11 and 10b are provided is $3\lambda/2$ ($=2\times3\lambda/4$) dephased. Therefore, the electrode end reflection wave generated from these outermost electrode fingers 9b and 9b' cancel with each other to suppress the electrode edge reflection wave E shown in FIG. 8.

Further, in the present embodiment, the following undesired waveform can also be decreased. More particularly, when a surface acoustic wave generated in the input IDT 2 and propagating in the opposite direction to the output IDT 3 is reflected at the electrode end of input IDT 2 at one end opposite to the output IDT 3, the thus generated electrode end reflection wave is transmitted to the output IDT 3 to generate an undesired response waveform which in turn causes the aforementioned ripple. In the present embodiment, the dummy electrode 12 is provided to the outermost electrode finger 9d of input IDT 2 at one edge opposite to the output IDT 3 as described in connection with FIG. 1 and an electrode end reflection wave is generated by the dummy electrode 12. This latter electrode end reflection wave is $\lambda/2$ dephased from the aforementioned former electrode end reflection wave and they cancel with each other. Accordingly, the electrode, end reflection wave generated in the input IDT 2 can also be suppressed.

In this manner, in the present embodiment, the outermost electrode finger generating wave generated by the output IDT 3 and the electrode end reflection waves generated by the IDT's 2 and 3 can be suppressed effectively, thereby preventing the ripple from being generated within a desired frequency band in the frequency/amplitude characteristic and group delay time characteristic.

When the surface acoustic wave reaches the output IDT 3, it partly undergoes a phase shift by the dummy electrode 10a. In other words, a slight phase difference is caused between one portion of surface acoustic wave passing through the dummy electrode 10a and the other portion of surface acoustic wave not passing therethrough. The dummy electrode 13 for phase correction is adapted to prevent this phase difference. Where the output IDT 3 has an aperture length $L_0$, the dummy electrode 13 for phase correction has a length obtained by subtracting the length of dummy electrode 10a from the aperture length $L_0$ and is expressed by the following equation:

$$L_0-(L_1/2)$$

An electrode aperture length of the dummy electrode 13 equals that of the dummy electrode 10a of the output IDT 3, amounting to $\lambda/2$. The dummy electrode 13 is so disposed as not to oppose the dummy electrode 10a of the output IDT 3 in the propagation direction of the surface acoustic wave. Thus, part of the surface acoustic wave generated in the input IDT 2 passes through this dummy electrode 13 for phase correction and the remainder passes through the dummy electrode 10a of the output IDT 3. This makes all portions of the surface acoustic wave coming into the output IDT 3 from the input IDT 2 be in phase. The provision of the dummy electrode 13 for phase correction is not always necessary but thanks to this dummy electrode, the electrode end reflection wave and the reflection wave from the outermost electrode finger can be suppressed more effectively.

Figure 3:
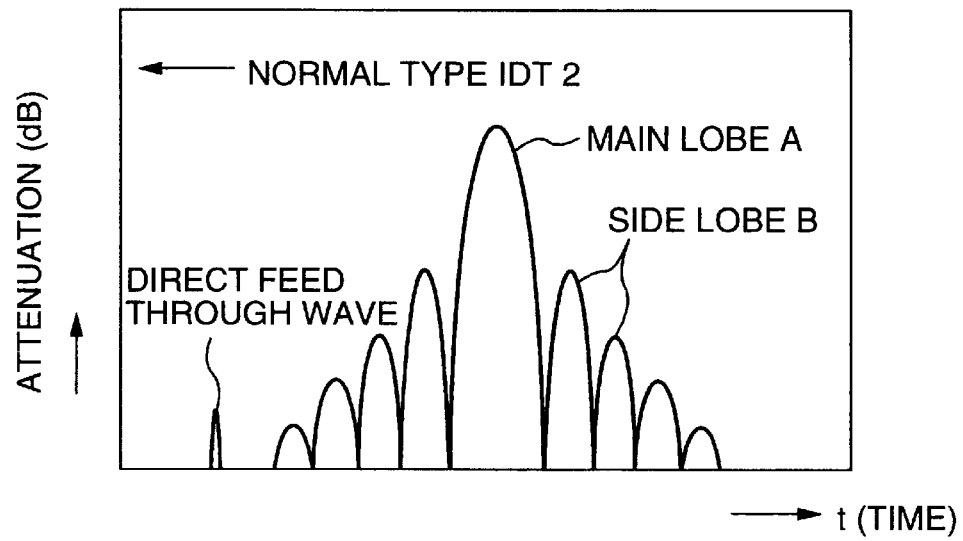
FIG. 3 is a graph showing a filter characteristic of the embodiment shown in FIG. 1.

A time domain characteristic in the present embodiment is shown in FIG. 3. As will be clear from a comparison with FIG. 8, the outermost electrode finger generating wave is suppressed to provide a characteristic analogous to the envelope of electrode finger overlapping aperture length W2 of the aperture weighted transducer. The electrode end reflection wave can also be suppressed to greatly decrease the ripple within a desired frequency band of the frequency/amplitude characteristic and in the group delay time characteristic, the conventional ripple of about 100 nsec can be halved to about 50 nsec.

Figure 4:
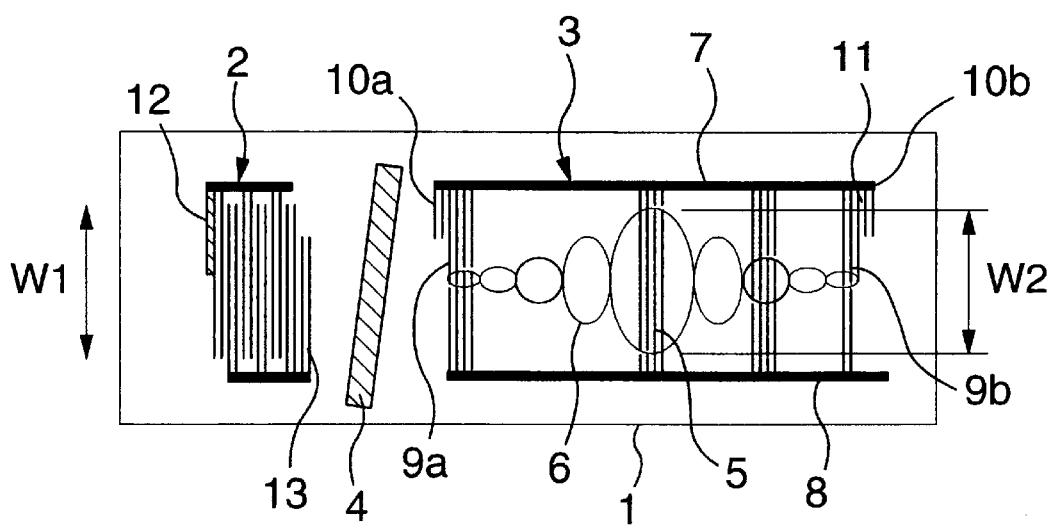
FIG. 4 is a diagram showing a second embodiment of the SAW device according to the present invention.
Figure 5:
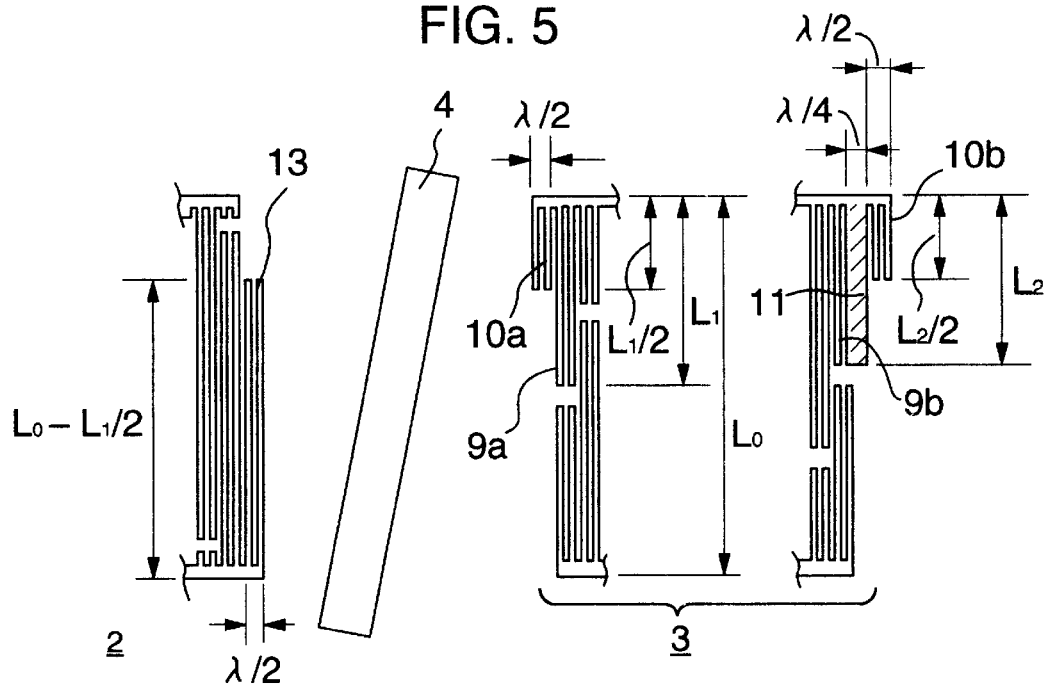
FIG. 5 is an enlarged view showing essential parts of the embodiment shown in FIG. 4.

Referring to FIG. 4, a second embodiment of the SAW device according the present invention is constructed as shown therein. Essential parts of the second embodiment are shown in enlarged form in FIG. 5, with portions corresponding to those of FIGS. 1 and 2 designated by identical reference numerals.

In the foregoing first embodiment, each of the dummy electrodes 10a and 10b and the dummy electrode 13 for phase correction takes the form of an allover deposition structure but in the second embodiment, these dummy electrodes have each a split type transducer in which electrode fingers each having a aperture length of $\lambda/8$ are juxtaposed at the same $\lambda/8$ intervals. Excepting the above, the second embodiment structurally resembles the first embodiment.

In the second embodiment, too, the outermost electrode finger generating wave and the electrode end reflection wave can be suppressed sufficiently and effects similar to those of the first embodiment can be attained.

In the foregoing first and second embodiments, the outermost electrode finger 9b on the side of hot bus bar 7 is provided with the dummy electrode 11 for suppression of the electrode end reflection wave. Since the electrode finger overlapping aperture length W2 is minimized at the outermost electrode finger 9b, the length L2 of the outermost electrode finger 9b substantially equals the length of the confronting outermost electrode finger 9b' on the side of bus bar 8. Accordingly, the dummy electrode 11 may be provided to the outermost electrode finger 9b' to attain effects similar to those described as above. This holds true for the dummy electrode 12 of the input IDT 2.

Figure 6:
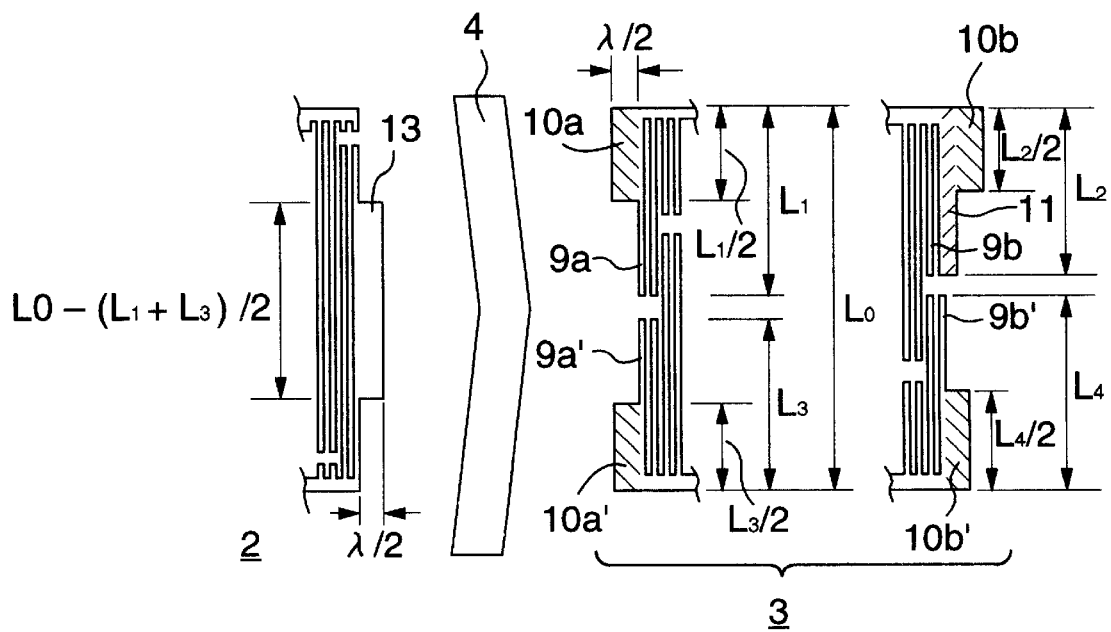
FIG. 6 is an enlarged view showing a third embodiment of the SAW device according to the present invention.

Referring to FIG. 6, a third embodiment of the SAW device according to the present invention is constructed as shown therein. In FIG. 6, an outermost electrode finger 9a' and dummy electrodes 10a' and 10b' are depicted, and portions corresponding to those illustrated in the preceding figures are designated by identical reference numerals and will not be described to avoid prolixity.

Exemplarily, in the foregoing first and second embodiments, one bus bar side of the output IDT 3 is hot with the other bus bar side being earth and signals are taken out of the output IDT 3 in non-parallel fashion. Contrary to this, in the third embodiment, the bus bars on the both sides are not grounded and signals are taken out of the output IDT 3 in parallel fashion.

In FIG. 6, both the sides of bus bars 7 and 8 are hot and therefore, outermost electrode finger generating waves are generated at not only outermost electrode fingers 9a and 9b on the side of bus bar 7 but also outermost electrode fingers 9a' and 9b' on the side of bus bar 8. Accordingly, in the third embodiment, the outermost electrode finger 9a' on the side of bus bar 8 is provided with the dummy electrode 10a' having a length which is ½ of a length $L_3$ of the outermost electrode finger 9a' and an electrode aperture length of $\lambda/2$ and the outermost electrode finger 9b' is provided with the dummy electrode 10b' having a length which is ½ of a length $L_4$ of the outermost electrode finger 9b' and an electrode aperture length of $\lambda/2$. With this construction, outermost electrode finger generating waves generated at the outermost electrode fingers 9a' and 9b' can be suppressed.

Electrode end reflection waves generated at the outermost electrode fingers of the output IDT 3 at one end opposite side to the input IDT 2 will now be described. On the assumption that an outermost electrode finger reflection wave generated at the outermost electrode finger 9b' is a reference wave of phase "0", an outermost electrode finger reflection wave generated at the dummy electrode 10b' provided to the outermost electrode finger 9b' is delayed by 2×λ/2=λ so as to be in phase with the reference wave. On the other hand, the phase of an outermost electrode finger reflection wave generated at the dummy electrode 11 provided to the outermost electrode finger 9b is delayed by 2×λ/4=λ/2 (namely, 180°) from the reference wave and the phase of an outermost electrode finger reflection wave generated at the dummy electrode 10b provided to the outermost electrode finger 9b is delayed by 2×3λ/4=3λ/2 (namely, 360°+180°) from the reference wave. Accordingly, these outermost electrode finger reflection waves generated at the four locations cancel with each other so as to be suppressed.

The outermost electrode finger 9b is provided with the dummy electrode 11 for suppressing the transducer edge reflection wave generated at the outermost electrode finger of output IDT 3 at one edge opposite to the input IDT 2 but alternatively, the dummy electrode 11 may be provided to the outermost electrode finger 9b' confronting the outermost electrode finger 9b.

An outermost electrode finger of the input IDT 2 at the other edge close to the output IDT 3 is provided with the dummy electrode 13 for phase correction which has a length indicated by the following equation:

$$L_0 - \{(L_1 + L_3)/2\}.$$

As in the case of the foregoing first and second embodiments, the dummy electrode 13 is so disposed as not to oppose the dummy electrodes 10a and 10a' of the output IDT 3 in the propagation direction of the surface acoustic wave.

As described above, in the third embodiment, too, effects similar to those in the foregoing embodiments can be attained. In the foregoing embodiments, the electrode finger constituting the IDT's 2 and 3 is of the split type, having a aperture length of λ/8 but alternatively, it may be of the solid type for the purpose of suppressing the electrode end reflection wave and the outermost electrode finger generating wave in a similar way. Each of the dummy electrodes 10a, 10b, 10a' and 10b' may have an electrode aperture length of λ/2 and each of the dummy electrodes 11 and 12 may have an electrode aperture length of λ/4 but they may be odd times the λ/2 (=nλ+λ/2) and odd times the λ/4 (=nλ+λ/4), respectively, to attain similar effects.

Further, the dummy electrode 13 for phase correction disposed on the side of input IDT 2 in the foregoing embodiments may be separated from the input IDT 2 so as to be disposed at a suitable location between the input and output IDT's 2 and 3.

The dummy electrode 12 is provided in the input IDT 2 to suppress the reflection wave at the electrode end of the input IDT as shown in FIG. 1 but even with this dummy electrode removed, the filter characteristic will not be degraded to a large extent and a good filter characteristic can be obtained.

In the foregoing embodiments, the length of the outermost electrode finger of the aperture weighted transducer has been described as being about ½ of the aperture length but fourth and fifth embodiments of the present invention to be described hereinafter are directed to examples where the present invention is applied to an outermost electrode finger having a length which is so designed as to deviate from the aforementioned condition.

Figure 9A:
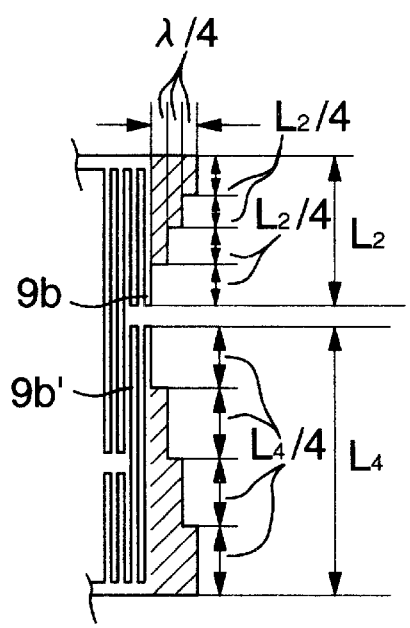
FIGS. 9A and 9B are diagrams respectively showing essential parts of fourth and fifth embodiments of the SAW device according to the present invention.
Figure 9B:
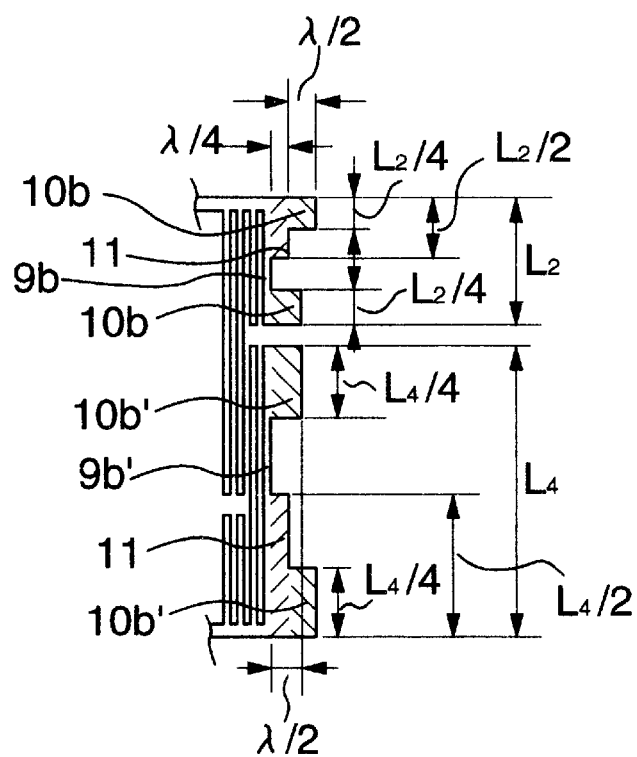

FIGS. 9A and 9B illustrate respectively the and the fifth embodiment of the invention, with portions corresponding to those in the foregoing figures designated by identical reference numerals. Like the foregoing third embodiment, signals are taken out not in grounded fashion but in parallel fashion in the fourth and fifth embodiments and the outermost electrode finger of output IDT 3 at one end opposite to the input IDT 2 is illustrated in enlarged form in th e figure.

In the fourth embodiment shown in FIG. 9A, outermost electrode fingers 9b and 9b' of the aperture weighted transducer are provided with dummy electrodes. The dummy electrodes have different lengths, one of the dummy electrodes having a length which is, as a whole, integer times ¼ of a length $L_2$ of one outermost electrode finger 9b and the other having a length which is, as a whole, integer times ¼ of a length $L_4$ of the other outermost electrode finger 9b', and have a aperture length which is, as a whole, integer times λ/4. The present embodiment can attain effects similar to those of the foregoing embod iments.

In the fifth embodiment shown in FIG. 9B, outermost electrode fingers 9b and 9b' of the aperture weighted transducer are provided with dummy electrodes 11. The dummy electrodes 11 have different lengths, one of the dummy electrodes 11 having a length which is integer times ½ of a length $L_2$ of one outermost electrode finger 9b and the other having a length which is integer times ½ of a length $L_4$ of the other outermost electrode finger 9b', and have each a aperture length which is integer times λ/4. In addition, dummy electrodes 10b are provided to a portion of outermost electrode finger 9b where the dummy electrode 11 is not formed and to the dummy electrode 11, respectively, and dummy electrodes 10b' are provided to a portion of outermost electrode finger 9b' where the dummy electrode 11 is not formed and to the dummy electrode 11, respectively. Each of the dummy electrodes 10b has a length which is ¼ of the length $L_2$ and a aperture length of λ/2 and each of the dummy electrodes 10b' has a length which is ¼ of the length $L_4$ and a aperture length of λ/2. The present embodiment can attain effects similar to those of the foregoing embodiments.

As has been described, according to the present invention, the electrode end reflection wave and outermost electrode finger generating wave generated at the end of the IDT as well as the substrate end reflection wave can be suppressed at a time and the ripple can be prevented from occurring within the desired frequency band in the frequency/amplitude characteristic and the group delay time characteristic. Accordingly, the number of electrode fingers of the IDT can be increased to increase the margin of design of a SAW device having good characteristics.

Obviously, the present invention can also be carried out in modes other than the foregoing embodiments without departing from the spirits and principal features of the present invention. Accordingly, the foregoing embodiments are mere examples of the present invention in all respects and are in no way considered to be limitative. The scope of the present invention is obvious from appended claims. Modifications and alterations equivalent to recitations of the claims are within the framework of the present invention.

We claim:

1. A surface acoustic wave device having, on a piezoelectric substrate, an input interdigital transducer for transforming an electric signal into a surface acoustic wave and an output interdigital transducer disposed in opposite to said input interdigital transducer, for transforming the surface acoustic wave resulting from the transformation by said input interdigital transducer into an electric signal, said device comprising:

a first dummy electrode provided to a first outermost electrode finger of said output interdigital transducer, said first outermost electrode finger being located at one end of said output interdigital transducer opposite to said input interdigital transducer, and having an electrode aperture length of $\lambda/4$, where $\lambda$ represents a wavelength of said surface acoustic wave;

a second dummy electrode provided to a second outermost electrode finger of said input interdigital transducer, said second outermost electrode finger being located at one end of said input interdigital transducer opposite to said output interdigital transducer, and having an electrode aperture length of $\lambda/4$; and a third dummy electrode provided contiguously to said first dummy electrode and having an electrode aperture length of $\lambda/2$ and a length which is substantially ½ of that of said first outermost electrode finger;

wherein said first dummy electrode has a length substantially equal to a length of said first outermost electrode finger which substantially equals ½ of an aperture length of said output interdigital transducer, and said second dummy electrode has a length which is substantially ½ of that of said second outermost electrode finger.

2. A surface acoustic wave device according to claim 1 further comprising a fourth dummy electrode provided to a third outermost electrode finger of said output interdigital transducer, said third outermost electrode finger being on the other end of said output interdigital transducer close to said input interdigital transducer, and having an electrode aperture length of $\lambda/2$ and a length which is substantially ½ of that of said third outermost electrode finger.

3. A surface acoustic wave device according to claim 2 further comprising an electrode for phase correction provided to a fourth outermost electrode finger of said input interdigital transducer, said fourth outermost electrode finger being located on the other end of said input interdigital transducer close to said output interdigital structure, and having an electrode aperture length of $\lambda/2$ and a length which substantially equals a difference between the aperture length of said output interdigital transducer and the length of said fourth dummy lectrode.

4. A surface acoustic wave device according to claim 3, wherein said electrode for phase correction is so disposed as not to oppose said fourth dummy electrode in the propagation direction of said surface acoustic wave.

5. A surface acoustic wave device according to claim 3, wherein at least one of said third and fourth dummy electrodes and said electrode for phase correction has a split type transducer.

6. A surface acoustic wave device according to claim 2 wherein, when each of said input and output interdigital transducers has both sides of which one is the power supply side and the other is the earth side, said first, second, third and fourth dummy electrodes are provided to said power supply side of respective interdigital transducers.

7. A surface acoustic wave device having, on a piezoelectric substrate, an input interdigital transducer for converting a surface acoustic wave into an electric signal and an output interdigital transducer, disposed to oppose said input interdigital transducer, for converting the surface acoustic wave resulting from the conversion by said input interdigital transducer into an electric signal, comprising:

a first dummy electrode provided to a first outermost electrode finger of said output interdigital transducer, said first outermost electrode finger being located at one end of said output interdigital transducer opposite to said input interdigital transducer, and having an electrode aperture length of $\lambda/2$ where $\lambda$ represents a wavelength of said surface acoustic wave and a length which is substantially ½ of that of said first outermost electrode finger; and a second dummy electrode provided to a second outermost electrode finger of said output interdigital transducer, said second outermost electrode finger being located at the other edge of said output interdigital transducer close to said input interdigital transducer, and having an electrode aperture length of $\lambda/2$ and a length which is substantially ½ of that of said second outermost electrode finger.

8. A surface acoustic wave device according to claim 7, wherein said first and second dummy electrodes are disposed on the positive polarity side of said output interdigital transducer.

9. A surface acoustic wave device having, on a piezoelectric substrate, an input interdigital transducer for transforming an electric signal into a surface acoustic wave and an output interdigital transducer, disposed in opposite to said input interdigital transducer, for transforming the surface acoustic wave resulting from the transformation by said input interdigital transducer into an electric signal, said device comprising:

a first dummy electrode provided to a first outermost electrode finger of said output interdigital transducer, said first outermost electrode finger being located at one end of said output interdigital transducer opposite to said input interdigital transducer, and having an electrode aperture length of $\lambda/4$, where $\lambda$ represents a wavelength of said surface acoustic wave;

a second dummy electrode provided to a second outermost electrode finger of said input interdigital transducer, said second outermost electrode finger being located at one end of said input interdigital transducer opposite to said output interdigital transducer, and having an electrode aperture length of $\lambda/4$; and a third dummy electrode provided to a third outermost electrode finger of said output interdigital transducer, said third outermost electrode finger being on the other end of said output interdigital transducer close to said input interdigital transducer, and having an electrode aperture length of $\lambda/2$ and a length which is substantially ½ of that of said third outermost electrode finger.

10. A surface acoustic wave device according to claim 9, further comprising an electrode for phase correction provided to a fourth outermost electrode finger of said input interdigital transducer, said fourth outermost electrode finger being located on the other end of said input interdigital transducer close to said output interdigital structure, and having an electrode aperture length of $\lambda/2$ and a length which substantially equals a difference between the aperture length of said output interdigital transducer and the length of said third dummy electrode.

11. A surface acoustic wave device according to claim 10, wherein said electrode for phase correction is so disposed as not to oppose said third dummy electrode in the propagation direction of said surface acoustic wave.

12. A surface acoustic wave device having, on a piezoelectric substrate, a first interdigital transducer for transforming an electric signal into a surface acoustic wave and a second interdigital transducer, disposed in opposite to said first interdigital transducer, for transforming the surface acoustic wave resulting from the transformation by said first interdigital transducer into an electric signal, said device comprising:

a first dummy electrode provided at a first outermost electrode finger of said second interdigital transducer, said first outermost electrode finger being located at one of the other sides of said first and second interdigital transducers wherein the one sides of said first and second interdigital transducers are opposed each other, and having an electrode aperture length of $\lambda/4$, where $\lambda$ represents a wavelength of said surface acoustic wave; and a second dummy electrode provided at said one of the other sides of said first and second interdigital transducers and contiguously to said first dummy electrode and having an electrode aperture length of $\lambda/2$ and a length which is substantially ½ of that of said first outermost electrode finger;

wherein said first dummy electrode has a length substantially equal to a length of said first outermost electrode finger which substantially equals ½ of an aperture length of said second interdigital transducer.

* * * * *